United States Patent
Miller et al.

[11] Patent Number: 5,990,699
[45] Date of Patent: Nov. 23, 1999

[54] METHOD FOR DETECTING OPENS THROUGH TIME VARIANT CURRENT MEASUREMENT

[75] Inventors: Anthony C. Miller; Wayne M. Needham, both of Gilbert, Ariz.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/587,088

[22] Filed: Jan. 16, 1996

[51] Int. Cl.$^6$ .................................................. G01R 31/26
[52] U.S. Cl. ............................................. 324/769; 324/719
[58] Field of Search ................................... 324/769, 718, 324/719, 722

[56] References Cited

U.S. PATENT DOCUMENTS

| | | | |
|---|---|---|---|
| 4,551,671 | 11/1985 | Annunziata et al. | 324/539 |
| 4,748,652 | 5/1988 | Nagai et al. | 379/26 |
| 5,025,344 | 6/1991 | Maly et al. | 361/88 |
| 5,057,774 | 10/1991 | Verhelst et al. | 324/537 |
| 5,519,335 | 5/1996 | Thomas | 324/765 |
| 5,552,744 | 9/1996 | Burlison et al. | 327/401 |

*Primary Examiner*—Josie Ballato
*Assistant Examiner*—Russell M. Kobert
*Attorney, Agent, or Firm*—Blakely, Sokoloff, Taylor & Zafman.

[57] ABSTRACT

A method for detecting open circuits in a semiconductor device, more specifically in a static CMOS device. A device to be tested is powered-up and the clock on the device is stopped so that the device enters a quiescent state. Once the device has reached a quiescent state a first current is measured and after a specified period of time a second current is also measured. The first current and the second current are then compared to determine if there is a defect, i.e. an open circuit, in the device. The determination as to whether or not a device is defective is based upon the difference between the first and second current measurements.

18 Claims, 1 Drawing Sheet

METHOD FOR DETECTING OPENS THROUGH TIME VARIANT CURRENT MEASUREMENT

BACKGROUND OF THE INVENTION

1. Field of the Invention

This invention relates to the field of semiconductor devices, and more specifically, to a process for detecting open defects in a semiconductor device.

2. Background Information

In the manufacture of semiconductor devices it is important to have methods for testing a device and determining if it is a good device or if it contains defects before selling such a product to a customer. Some methods of testing a device for defects use a "modeling" system. In a modeling system there is at least one device which is presumably not defective. This non-defective model (model) is tested and the results are stored in a memory. Other devices which are like the model are then tested and the results of the tested devices are compared to the results of the model. If the results are the same or are within a manufacturer's tolerance levels (i.e. a manufacturer's acceptable ranges for deviation from the model) then the device is presumably a good or non-defective device and may be sold to a customer. If the results are not the same and are not within the manufacturer's tolerance levels then the device is a defective device and cannot be sold to a customer.

A Stored Response Pattern Tester (SRPT) is one system used to test CMOS devices. The SRPT (tester) works by storing several tester patterns in the RAM memory of the tester and applies those patterns to a device under test (DUT) at an operating frequency and compares the device response to the model. In other words, an operating voltage is applied to the input of the DUT, the tester then measures the voltage at the output pins of the DUT (measured voltage) and compares that value, i.e. the measured voltage, to the expected stored response (expected voltage) which is stored in the memory of the tester. Defective, or bad devices, are detected by voltage differences between the measured voltage and the expected voltage at that output pin of the DUT.

FIG. 1 illustrates a device under test (DUT) 100. Circuit 110, from point A to point B, represents a properly connected circuit. Circuit 120, from point C to point D, represents an open circuit. When testing DUT 100 with the SRPT (tester), described above, a voltage is applied to point A and the voltage at point B is then measured. The measured voltage is then compared to the expected voltage stored within the memory of the tester. Since circuit 110 is a properly connected circuit the measured voltage is the same (or within tolerance level) as the expected voltage, thus the circuit tests "good".

One problem with the SRPT is that it may not be able to detect open circuits. For example, a disconnected gate in a device in some cases may not appear as an open circuit when testing with an SRPT. When a voltage is applied at an input on a circuit, a disconnected gate may appear to be "connected" since the voltage applied to a circuit ($V_{DD}$) appears across the gate due to capacitive coupling and/or tunneling effects.

FIG. 1 illustrates circuits 110 and 120. Both circuits 110 and 120 are made of two transistors, transistors 140 and 150 and transistors 160 and 170, respectively.

Circuit 110 is properly connected and has an intact gate input 130. Thus when testing circuit 110 with the SRPT, a voltage is applied at point A and the voltage at point B is measured. Because the gate input of circuit 110 is properly connected the measured voltage at point B is within the tolerance levels of the expected voltage and the device will test as "good."

Circuit 120, however, is improperly connected and has a gate input open 125. When testing circuit 120 with an SRPT, a voltage is applied at point C and the voltage at point D is measured. Because circuit 120 has a gate input open 125 the measured voltage may be significantly less than the expected voltage and the device would test as "defective". However, due to capacitive coupling and/or tunneling effects the voltage applied to the circuit, $V_{DD}$, may "tunnel" across transistors 160 and 170 showing a voltage potential between $V_{DD}$ and Ground at point D. Therefore, the measured voltage at point D may be within tolerance levels of the expected voltage and the device would test as "good". It should be noted that capacitive coupling and tunneling effects are well known in the art and are not described herein in detail. Thus, there is no way to determine if an SRPT actually detects an open circuit in a device. Because of this some defective devices (i.e. devices with open circuits) may be passed on to a customer.

Thus, what is needed is an accurate method for detecting open circuits in a semiconductor device.

SUMMARY OF THE INVENTION

The present invention describes a method for detecting open circuits in a semiconductor device, more specifically in a static CMOS device. One preferred embodiment of the present invention powers-up a device and then measures a first current and a short time later measures a second current in the device. The first and second currents are then compared to determine if there is a defect, i.e. an open circuit in the device. The determination as to whether or not a device is defective is based upon the difference between the first and second current measurements.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

A method for detecting opens through time variant current measurement is disclosed. In the following description, numerous specific details are set forth such as specific devices, parameters, etc. in order to provide a thorough understanding of the present invention. It will be obvious, however, to one skilled in the art that these specific details need not be employed to practice the present invention. In other instances, well known effects, materials, or methods have not been described in detail in order to avoid unnecessarily obscuring the present invention.

The present invention describes a method for detecting open circuits in semiconductor devices. As device characteristics of semiconductors become smaller and more dense, testing the circuitry of such devices becomes harder. As stated in the background of the invention, it is important to have an accurate method for detecting defects in a semiconductor device such that "bad" or defective devices are not sold to a customer.

Rather than measuring voltage, as described above with respect to an SRPT tester, the present invention tests a device by measuring the current. Measuring the current allows defects such as open circuits to be detected. In a CMOS device when the clock is stopped, the device is said to be in a quiescent state, thus the current in the device is called drain to drain quiescent current ($I_{DDQ}$). When the clock is running the device is said to be in active state, thus the current in the device is called drain to drain dynamic current ($I_{DDD}$). One embodiment of the present invention tests the device by measuring the drain to drain quiescent current ($I_{DDQ}$).

Figure 1:
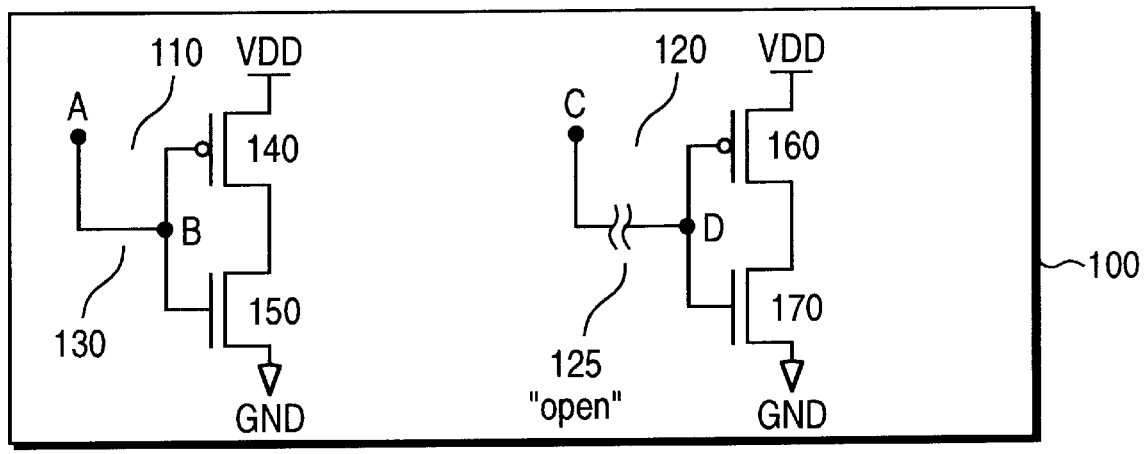
FIG. 1 illustrates a schematic of a device under test (DUT).

In order to illustrate the present invention the method is described below with reference to FIG. 1. It will be appreciated by one with ordinary skill in the art that the illustration in FIG. 1 has been simplified for the purpose of clarity. Device under test (DUT) 100 contains circuits 110 and 120. Each circuit is powered-up by applying an operating voltage ($V_{DD}$). After power-up, DUT 100 is placed into a low power or quiescent state. As described above, DUT 100 is in a quiescent state when the clock is stopped. It should be noted and it will be obvious to one with ordinary skill in the art that the low power range of DUT 100 may vary by device, but typically DUT 100 may be in a quiescent state at a power in the range of approximately 100 nanoamperes (namps) to 100 microamperes ($\mu$amps). As one example, the 80386EX device manufactured by Intel Corporation reaches the quiescent state when its power is in the range of approximately 30–100 namps.

After DUT 100 reaches a quiescent state it is beneficial to wait for a period of time (waiting period) before measuring the $I_{DDQ}$ of each circuit so that any transient currents may settle down and disperse. It will be appreciated by one with ordinary skill in the art that the waiting period may vary depending upon the type of device being tested. Generally a waiting period within the range of approximately 10–200 microseconds ($\mu$sec) will allow any transient currents to settle. In the example given above for the 80386EX device the waiting period is approximately 100 $\mu$sec.

Once DUT 100 has reached the quiescent state and any transient currents have been allowed to settle, a first $I_{DDQ}$ measurement is taken. It should be noted that the $I_{DDQ}$ may be measured using any current meter, however, it will be obvious that the accuracy of the current meter should reflect the particular manufacturer's desired tolerance levels. In other words, the tighter the manufacturer's desired tolerance levels the greater the required accuracy of the current meter.

After the first $I_{DDQ}$ measurement is taken and a specified period of time has passed, a second $I_{DDQ}$ measurement is taken. It should be noted that the second $I_{DDQ}$ measurement is also taken while DUT 100 remains in a quiescent state. In other words, none of the conditions on DUT 100 are changed, for example, the clock remains stopped and is not be started and stopped between measurements. The second $I_{DDQ}$ measurement however is not taken immediately after the first measurement. The specified time period between the two measurements may also depend upon the desired tolerance level of a particular manufacturer. If a particular manufacturer has a tight tolerance level, then only a small change in the current would satisfy that manufacturer's test and because it does not take long to detect a small change in current, the time period between the two measurements may be small. If a particular manufacturer has a loose tolerance level, then a large change in the current is necessary to satisfy that manufacturer's test and because it takes a longer period of time to detect a large change in the current, the time period between the two measurements may be large. Due to the difference in tolerance levels amongst manufacturers the time period between the two measurements may range from approximately 100 $\mu$sec to approximately 100 msec.

Once the second measurement is taken the two measurements are then compared to determine if any defects are present on the device. Under normal conditions (i.e. no defects) the current for a circuit will become stable in a very short time (usually microseconds) and by the time the current is measured using the present invention (after the waiting period) no changes (or no significant changes) in the current are measured. If the measured $I_{DDQ}$ is stable and does not drift outside a specified range (i.e. tolerance level) of operation then DUT 100 is considered "good" and does not contain an open. However, if the measured $I_{DDQ}$ drifts or changes outside the specified range of operation, this indicates that the device has a defect, i.e. an open, and DUT 100 is considered "bad" or defective.

It should be noted that the specified ranges or tolerance levels are set by the manufacturer and may vary depending upon the type of device being tested, the complexity and size of the device, the starting current, etc. Additionally, it should be noted that what may be considered a "bad" or defective device in one instance may have other uses where a certain number or type of defect may be acceptable and is therefore a "good" device for that particular application.

Referring again to FIG. 1, when testing circuit 110, because circuit 110 is a properly connected circuit, no change between the first $I_{DDQ}$ measurement and the second $I_{DDQ}$ measurement is found. The voltage input B of circuit 110 (i.e. transistors 140 and 150) is fixed to the voltage A via intact gate input 130. When in a quiescent state, circuit 110 will have one transistor in an on-state and the other transistor in an off-state. The transistor of the pair 140 and 150 that is in an off-state prevents current flow (i.e. $I_{DDQ}$) from the $V_{DD}$ to Ground. Thus circuit 110 is good.

When testing circuit 120, however, a change in the current may be found between the first $I_{DDQ}$ measurement and the second $I_{DDQ}$ measurement because circuit 120 is an open circuit. The voltage input D of circuit 120 (i.e. transistors 160 and 170) is not fixed to the voltage C due to gate input open (open) 125. Because voltage input D is not held at the voltage of C transistors 160 and 170, which should either be in an on-state or an off-state respectively, are both in a partially on-state since there is no voltage at input D to hold them steady. Consequently, input D will drift (or float) to a voltage potential between $V_{DD}$ and Ground, due to open 125. The voltage at D drifts over time (i.e. "time variant") causing transistors 160 and 170 to be in a partial on-state which allows a current to flow from $V_{DD}$ to Ground. Thus, $I_{DDQ}$ will fluxuate (as the voltage at point D fluxuates) and circuit 120 is "bad" or defective.

Figure 2:
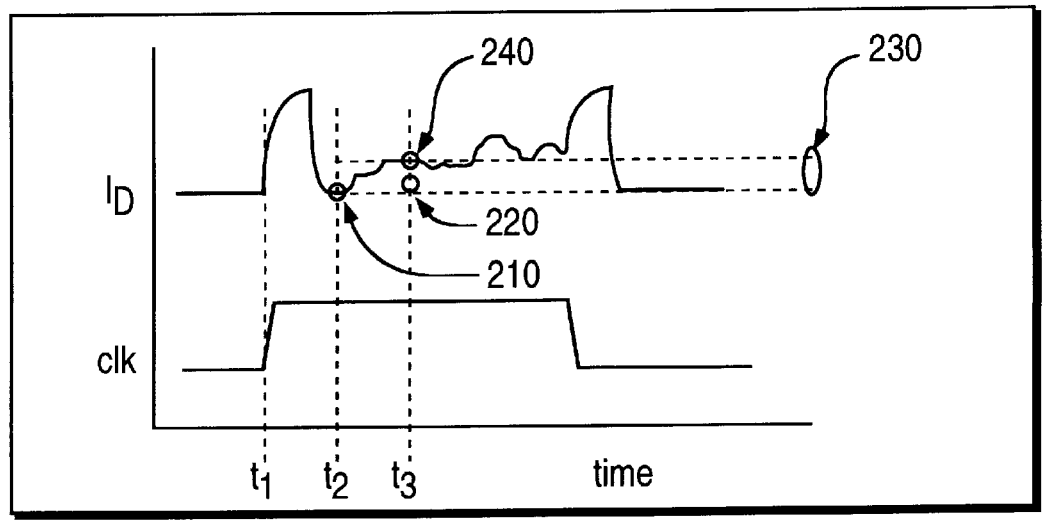
FIG. 2 is a graph of the current in a device under test and illustrates how the present invention may be used.

FIG. 2 depicts a graph of $I_{DDQ}$ versus time for a DUT. Assuming the DUT has already been powered-up at $t_1$ the clock (clk) is stopped so that the DUT enters a quiescent state. The waiting period $t_1$–$t_2$ allows the transient currents of the DUT to settle and the first $I_{DDQ}$ measurement 210 is taken at $t_2$. As stated above a specified period of time is allowed to elapse before the second $I_{DDQ}$ measurement is taken at $t_3$. If the DUT is good and no defects are found there is no difference or minimal difference between the first measurement 210 and the second measurement 220. However, if the DUT is bad and a defect is found then there is a drift difference 230 between first measurement 210 and second measurement 240.

It should be noted and it will be obvious to one with ordinary skill in the art that, the $I_{DDQ}$ may be measured after power-up and while the clock is stopped or if the DUT 100 has been running (i.e. the clock has started) the $I_{DDQ}$ may be measured after the clock has been stopped without having to power-down and repower-up the device. The number of times DUT 100 is clocked will have no effect on the present invention so long as the $I_{DDQ}$ measurements are made while DUT 100 is in a quiescent state. It will also be obvious to one with ordinary skill in the art that the $I_{DDQ}$ may be measured more than twice. Depending upon the accuracy desired the $I_{DDQ}$ may be measured any number of times and those measurements may be compared to one another in order to determine if a defect is detected in the device.

It should also be noted and it will be obvious to one with skill in the art, that the present invention may be used in conjunction with prior art systems to provide an even more accurate method for detecting defects in a semiconductor device. For example, the present invention may be used in conjunction with the SRPT tester (described above in the background of the invention) to account for the SRPT's inability to reliably detect open circuits.

Thus, a method for detecting opens through time variant current measurement has been described. Although specific embodiments, including specific equipment, parameters, methods, etc. have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method to detect defects in a CMOS device comprising:

powering up said CMOS device;

measuring a first current;

measuring a second current, wherein said CMOS device is not repowered between said steps of measuring said first current and said second current;

comparing said first current with said second current;

determining if an open defect is detected in said CMOS device, wherein said step of determining if a defect is detected is based upon a difference between said first and said second current measurements.

2. The method as described in claim 1 further comprising the step of:

waiting for said CMOS device to reach a quiescent state, wherein said step of waiting for said semiconductor device to reach a quiescent state is performed after said step of powering said device and before said step of measuring said first current.

3. The method as described in claim 2 wherein said step of waiting for said CMOS device to reach a quiescent state is performed for a period of approximately 10–200 $\mu$sec.

4. The method as described in claim 1 wherein said step of measuring said first current is performed after said CMOS device has reached a quiescent state.

5. The method as described in claim 1 wherein said step of measuring said second current is performed after a specified period of time has passed since said first current was measured.

6. The method as described in claim 5 wherein said specified period of time is in the range of approximately 100 $\mu$sec to 100 msec.

7. The method as described in claim 1 wherein said step of measuring second current measurement is also performed while said CMOS device is in a quiescent state.

8. The method as described in claim 1 wherein said step of determining if a defect is detected is based upon a difference between said first and said second current measurements.

9. A method to detect defects in a semiconductor device comprising:

powering up said semiconductor device;

waiting for said semiconductor device to reach a quiescent state;

measuring a first current;

measuring a second current, wherein said semiconductor device is not repowered between said steps of measuring said first current and said second current;

comparing said first current with said second current;

determining if an open defect is detected in said semiconductor device, wherein said step of determining if a defect is detected is based upon a difference between said first and said second current measurements.

10. The method as described in claim 9 wherein said step of waiting for said semiconductor device to reach a quiescent state is performed for a period of approximately 10–200 $\mu$sec.

11. The method as described in claim 9 wherein said step of measuring said second current is performed after a specified period of time has passed since said first current was measured.

12. The method as described in claim 11 wherein said specified period of time is in the range of approximately 100 $\mu$sec to 100 msec.

13. The method as described in claim 9 wherein said step of measuring second current measurement is also performed while said device is in a quiescent state.

14. The method as described in claim 9 wherein said step of determining if a defect is detected is based upon a difference between said first and said second current measurements.

15. A method to detect defects in a semiconductor device comprising:

powering up said semiconductor device;

waiting for said semiconductor device to reach a quiescent state;

measuring a first current;

waiting for a specified period of time;

measuring a second current, wherein said semiconductor device is not repowered between said steps of measuring said first current and said second current;

comparing said first current with said second current;

determining if an open defect is detected in said semiconductor device, wherein said step of determining if a defect is detected is based upon a difference between said first and said second current measurements.

16. The method as described in claim 15 wherein said step of waiting for said semiconductor device to reach a quiescent state is performed for a period of approximately 10–200 $\mu$sec.

17. The method as described in claim 15 wherein said specified period of time is in the range of approximately 100 $\mu$sec to 100 msec.

18. The method as described in claim 15 wherein said step of measuring second current measurement is also performed while said device is in a quiescent state.

\* \* \* \* \*